US010565323B2

(12) United States Patent
Chen et al.

(10) Patent No.: US 10,565,323 B2
(45) Date of Patent: Feb. 18, 2020

(54) GENERATING AN IMAGE FOR A BUILDING MANAGEMENT SYSTEM

(71) Applicant: Honeywell International Inc., Morristown, NJ (US)

(72) Inventors: Henry Chen, Beijing (CN); Jian Geng Du, Beijing (CN); Yan Xia, Beijing (CN); John D. Morrison, Mount Colah (AU)

(73) Assignee: Honeywell International Inc., Morris Plains, NJ (US)

( * ) Notice: Subject to any disclaimer, the term of this patent is extended or adjusted under 35 U.S.C. 154(b) by 899 days.

(21) Appl. No.: 14/597,443

(22) Filed: Jan. 15, 2015

(65) Prior Publication Data

US 2016/0210375 A1 Jul. 21, 2016

(51) Int. Cl.
*G06F 17/50* (2006.01)

(52) U.S. Cl.
CPC ................... *G06F 17/5004* (2013.01)

(58) Field of Classification Search
CPC .................................................. G06F 17/5004
See application file for complete search history.

(56) References Cited

U.S. PATENT DOCUMENTS

| 4,964,060 A * | 10/1990 | Hartsog | G06F 17/5004 703/1 |
| 8,117,558 B2 * | 2/2012 | Hoguet | G06Q 30/0601 382/282 |
| 9,177,085 B2 * | 11/2015 | Snyder | G06F 17/5004 |
| 9,525,976 B2 * | 12/2016 | Dharwada | H04W 4/33 |
| 2004/0128116 A1 * | 7/2004 | Normann | G06F 17/5004 703/1 |
| 2009/0307255 A1 * | 12/2009 | Park | G06Q 10/10 |
| 2011/0057929 A1 | 3/2011 | Chen et al. | |
| 2011/0209081 A1 * | 8/2011 | Chen | G06F 17/50 715/771 |
| 2011/0218777 A1 | 9/2011 | Chen et al. | |

FOREIGN PATENT DOCUMENTS

| EP | 2615862 | 7/2013 |
| WO | 2012065281 | 5/2012 |
| WO | 2013138975 | 9/2013 |

(Continued)

OTHER PUBLICATIONS

AutoCAD Architecture 2011, User's Guide, Mar. 2010, Autodesk, Inc.*

(Continued)

*Primary Examiner* — Aniss Chad
(74) *Attorney, Agent, or Firm* — Seager Tufte & Wickhem LLP

(57) ABSTRACT

Methods, devices, and systems for generating an image for a building management system are described herein. One device includes using a computing device to import floor plan objects from computer-aided design (CAD) drawings of a building and applying a design language associated with a building management system to the floor plan objects imported from the CAD drawings. Once the design language has been applied to the floor plan objects, an image of the building is generated for use in the building management system.

19 Claims, 10 Drawing Sheets

(56) References Cited

FOREIGN PATENT DOCUMENTS

WO    2015000126    1/2015

OTHER PUBLICATIONS

Moss, Elise, Space Planning with AutoCAD Architecture 2008, Nov. 28, 2010, Schroff Development Corporation.*
Mufasu CAD, AutoCAD Tutorial Save your DWG into JPeg, Apr. 17, 2013, Retrieved from YouTube https://youtu.be/m9c3u84MOBc.*
Kensek, et al., "Practical BIM 2012: Management, Implementation Coordination and Evaluation", The USC BIM Symposium. Jul. 2012. 299 pages.

* cited by examiner

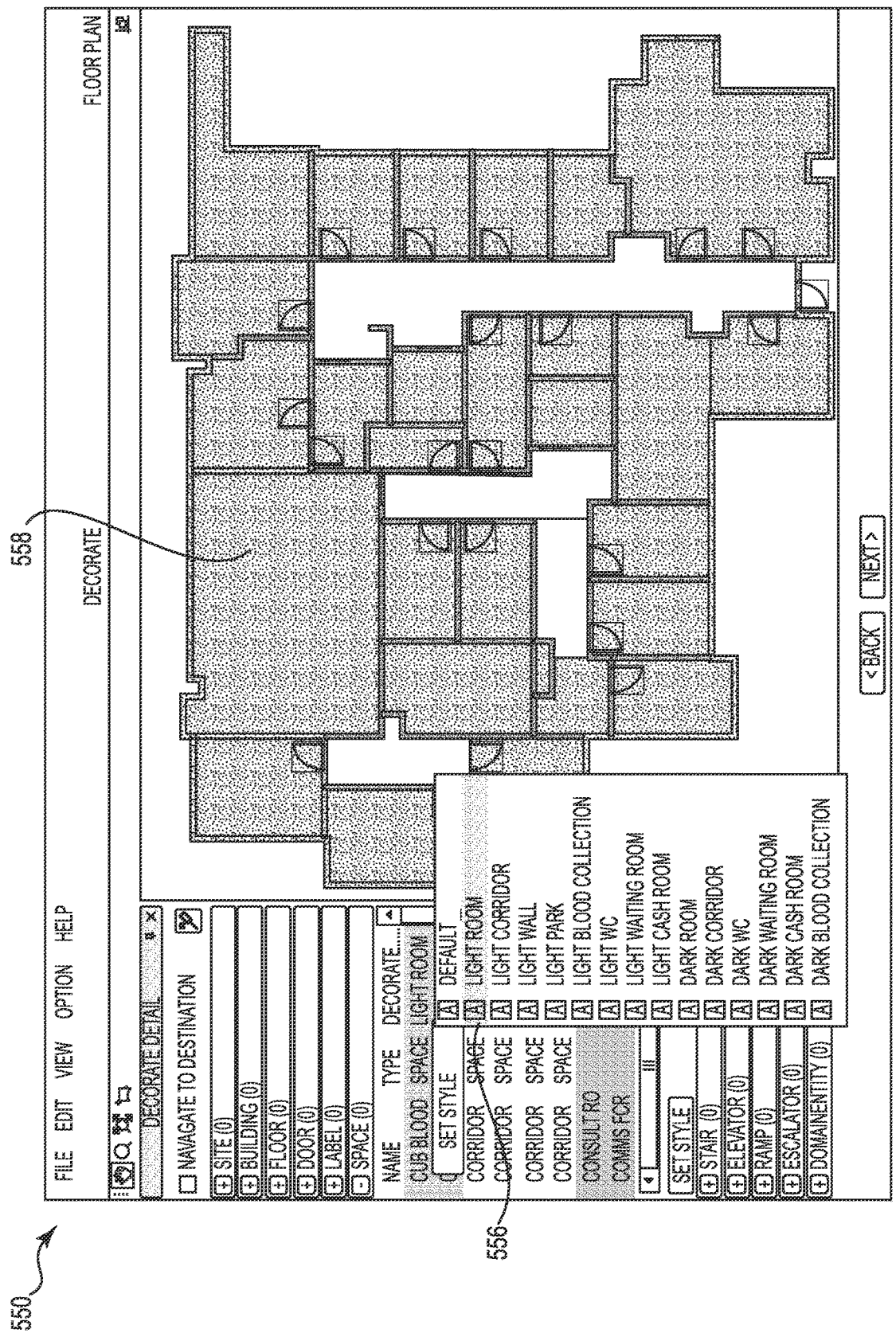

GENERATING AN IMAGE FOR A BUILDING MANAGEMENT SYSTEM

TECHNICAL FIELD

The present disclosure relates to methods, devices, and systems for generating an image for a building management system.

BACKGROUND

A building management system can be an easy and effective way to monitor various systems and equipment in a building. For example, a single user can monitor a building's ventilation, lighting, power, fire, security, and other systems from a single location. Additionally, a building management system can provide the user with important information regarding the performance of these systems.

Typically, the images for the building management system are generated using many different sets of software tools, including Adobe Photoshop, and Adobe Illustrator, among others. However, it may take a designer time and effort to create an image for an entire building for use in the building management system. Further, the designer may have to generate different element types (e.g., space types, connections, elements) of the building with the correct design language specified for the building management system. Manual generation of these elements and application of different design language styles can be extremely difficult and/or time consuming.

BRIEF DESCRIPTION OF THE DRAWINGS

FIGS. 5A-5D show an illustration of a display on a user interface showing the application of a design language to floor plan objects, in accordance with one or more embodiments of the present disclosure.

DETAILED DESCRIPTION

Figure 1:
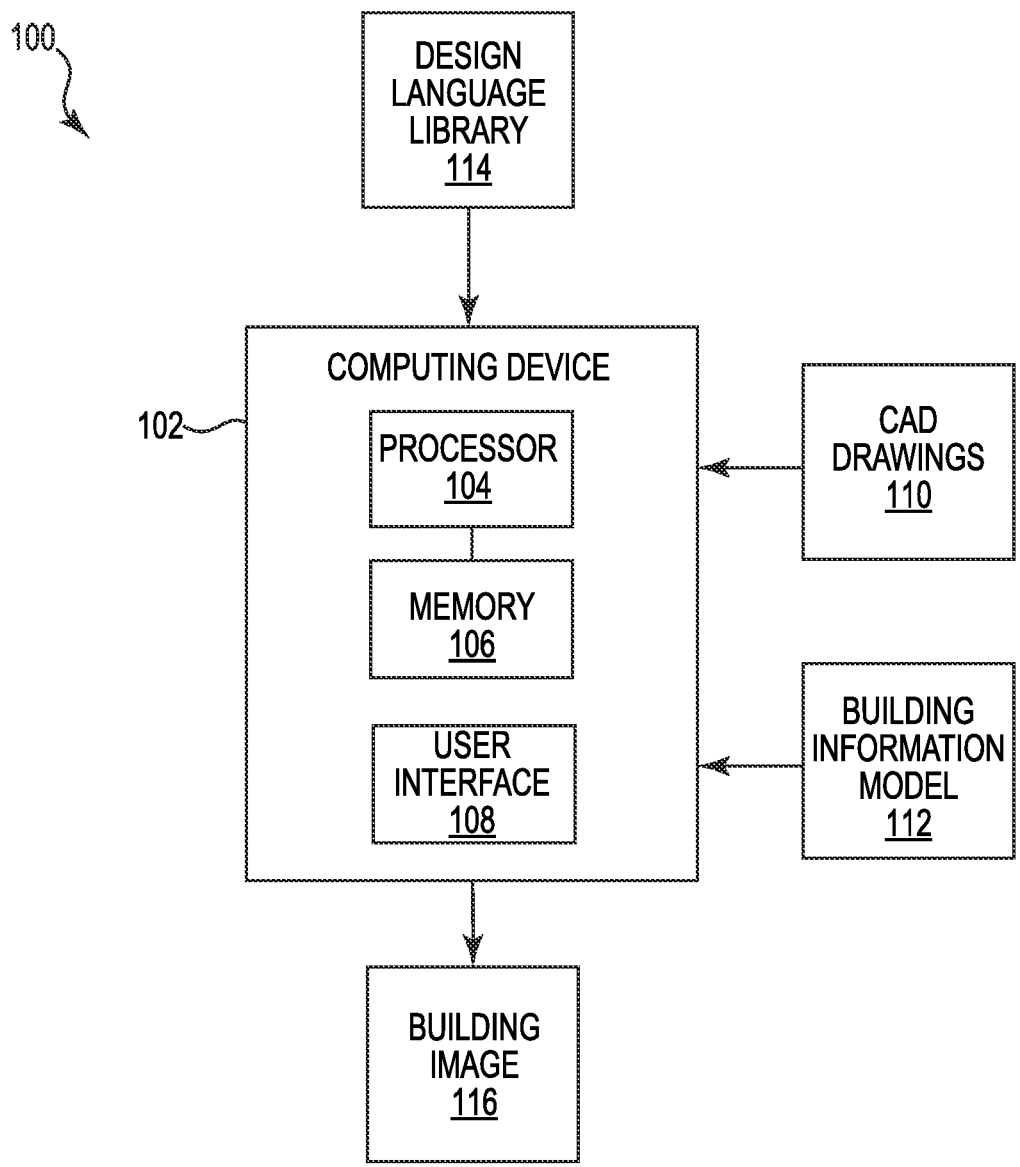
FIG. 1 is system for generating an image of a building for a building management system, in accordance with one or more embodiments of the present disclosure.

Methods, devices, and systems for generating an image for a building management system are described herein. For example, one or more embodiments include using a computing device to import floor plan objects from computer-aided design (CAD) drawings of a building and applying a design language associated with a building management system to the floor plan objects imported from the CAD drawings. Once the design language has been applied to the floor plan objects, an image of the building is generated for use in the building management system.

Images generated for use in building management systems, in accordance with the present disclosure, may be easier and/or faster to create than images generated using previous approaches. As a result, the cost in time and/or money in creating such images can be greatly reduced.

Further, the ability to generate the building images in accordance with a specified design language, as described in the present disclosure, can greatly improve the user experience and/or provide an effective way to present information to the user, as well as allowing for a cohesive implementation of design language across similarly branded products. While reducing human inefficiencies through automation, embodiments of the present disclosure can also provide increased flexibility for users through user-customization of device templates and/or device extraction, for example.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits.

As used herein, "a" or "a number of" something can refer to one or more such things. For example, "a number of floor plan objects" can refer to one or more floor plan objects.

FIG. 1 is a system 100 for generating an image of a building for a building management system, in accordance with one or more embodiments of the present disclosure. The building management system can be used (e.g., by a single user) to manage (e.g., monitor and/or control) the building. For example, the user can check and/or set the state of control components, equipment, devices, networks, areas, and/or spaces of the building using the building management system. For instance, the user can monitor the building's ventilation, lighting, power, fire, and security systems, among other systems, using the building management system. Additionally, the building management system can provide the user with important information regarding the performance of these systems.

As shown in FIG. 1, system 100 can include a computing device 102. Computing device 102 can be, for example, a laptop computer, a desktop computer, or a mobile device (e.g., a smart phone, tablet, personal digital assistant, etc.), among other types of computing devices.

Computing device 102, as shown in FIG. 1, can include a memory 106 and a processor 104 coupled to the memory 106. The memory 106 can be any type of storage medium that can be accessed by the processor 104 to perform various examples of the present disclosure. For example, the memory 106 can be a non-transitory computer readable medium having computer readable instructions (e.g., computer program instructions) stored thereon that are executable by the processor 104 to generate an image of a building for a building management system in accordance with the present disclosure. That is, processor 104 can execute the executable instructions stored in memory 106 to generate an image of a building for a building management system in accordance with the present disclosure.

The memory 106 can be volatile or nonvolatile memory. The memory 106 can also be removable (e.g., portable) memory, or non-removable (e.g., internal) memory. For example, the memory 106 can be random access memory (RAM) (e.g., dynamic random access memory (DRAM) and/or phase change random access memory (PCRAM)), read-only memory (ROM) (e.g., electrically erasable programmable read-only memory (EEPROM) and/or compact-disc read-only memory (CD-ROM)), flash memory, a laser disc, a digital versatile disc (DVD) or other optical storage, and/or a magnetic medium such as magnetic cassettes, tapes, or disks, among other types of memory.

Further, although memory 106 is illustrated as being located within computing device 102, embodiments of the present disclosure are not so limited. For example, memory 106 can also be located internal to another computing resource (e.g., enabling computer readable instructions to be downloaded over the Internet or another wired or wireless connection).

As shown in FIG. 1, computing device 102 includes a user interface 108. A user (e.g., operator) of computing device 102, such as, for instance, an operator of the building management system can interact with computing device 102 via user interface 108. For example, user interface 108 can provide (e.g., display and/or present) information to the user of computing device 102, and/or receive information from (e.g., input by) the user of computing device 102. For instance, in some embodiments, user interface 108 can be a graphical user interface (GUI) that can include a display (e.g., a screen) that can provide and/or receive information to and/or from the user of computing device 102. The display can be, for instance, a touch-screen (e.g., the GUI can include touch-screen capabilities). Alternatively, a display can include a television, computer monitor, mobile device screen, or other type of display device connected to computing device 102 and configured to receive a video signal output from the computing device 102.

As an additional example, user interface 108 can include a keyboard and/or mouse the user can use to input information into computing device 102. Embodiments of the present disclosure, however, are not limited to a particular type(s) of user interface.

As shown in FIG. 1, computing device 102 can import computer-aided design (CAD) drawings 110 of a building. Importing the CAD drawings can include importing floor plan objects from the CAD drawings, reducing the CAD drawings to basic geometric features, recognizing floor plan objects imported from the CAD drawings, importing floor plan object boundaries and labels from the CAD drawings, and binding the floor plan object labels to the floor plan object boundaries. As used herein, floor plan objects can include floor plan zones and floor plan domain entities.

In some embodiments, reducing the CAD drawings to basic geometric features can include reducing the CAD drawings to lines, arcs, rectangles, and basic texts. A CAD drawing can contain many layers of information about a building. For example, a CAD drawing of a single floor of a building may contain information about building layout, heating, ventilation, and air conditioning equipment (HVAC), electrical wiring diagrams detailing electrical layout, and security items. Reducing the CAD drawing to the basic geometry primitives like lines, arcs, rectangles, and texts greatly simplifies the drawing and removes information that is unnecessary for use in a building management system.

In some embodiments, computing device 102 can recognize the floor plan objects imported from the CAD drawings. For example, CAD drawings can contain boundaries of floor plan objects as well as the labels pertaining to those floor plan objects. The computing device can recognize those boundaries as objects to be imported from the CAD drawings. Further, the labels associated with the objects can be recognized and imported.

In some embodiments, floor plan zones can include a number of floor plan space types. Floor plan space types can describe the purpose of various floor plan zones within the building. For example, floor plan zones can contain floor plan space types that can include areas such as an office, conference room, waiting room, hallway, or stairway.

Floor plan space types can vary based on the type of building. For example, a hospital can include various floor plan space types such as waiting rooms, examination rooms, laboratories, and operating rooms. As another example, a school can include various floor plan space types such as classrooms, cafeterias, gymnasiums, and teacher's lounges.

In some embodiments, floor plan domain entities can include a number of different floor plan domain entity types. Domain entities can include objects installed on the floor plan that can provide real time information to a user of a building management system. For example, domain entity types can include systems such as card readers, cameras, smoke detectors, speakers, variable air volume (VAV) components, and air handling units (AHU's), among others.

Computing device 102 can import floor plan objects from CAD drawings by importing floor plan object boundaries from the CAD drawings and importing floor plan object labels from the CAD drawings. Floor plan object boundaries, as used herein, describe the floor plan object in the CAD drawings. Floor plan object labels, as used herein, describe the type and/or purpose of the floor plan objects. The computing device can recognize and bind the floor plan object labels with the appropriate (e.g., corresponding) floor plan object boundaries.

In some embodiments, domain entities can be imported with templates selected directly from the CAD drawings. For example, a user can select, directly from the CAD drawing, the template to be used for the domain entity in a building management system (e.g., the template used for the domain entity in the CAD drawing will be the template used in the building management system).

In some embodiments, domain entities can be imported with templates stored in a template library. For example, a user can select a template for the domain entity to be imported from a number of templates stored in design language library 114. A template library, as referred to herein, and as discussed in more detail below, can store device information such as particular devices contained in a domain, layers of graphical renderings containing particular domains and/or devices, and/or other information.

Computing device 102 can receive from a user, via user interface 108, an assignment of a floor plan space type for each of the number of floor plan zones in the floor plan objects. For example, in a hospital, the floor plan space types might serve purposes such as waiting rooms, examination rooms, laboratories, and operating rooms. In keeping with a selected design language, spaces of the same floor plan space type can be set as the same style to distinguish from other spaces of a different floor plan space type, as will be further described herein. Floor plan space types not designated by the user can be set as a default floor plan space type.

Computing device 102 can also receive from a user, via user interface 108, an assignment of a domain entity type for each of the number of floor plan domain entities in the floor plan objects. For example, domain entities can include card readers, cameras, smoke detectors, speakers, variable air volume (VAV) components, and air handling units (AHU's), among others. The user can designate the domain entity type so as to distinguish a first type of domain entity (e.g., security cameras) from a second type of domain entity (e.g., fire alarms). Domain entities not designated by the user can be set as a default domain entity type (e.g., generic).

In some embodiments, computing device 102 can import building drawings from a building information model 112 shown in FIG. 1, if a building information model associated with the building is available. For example, importing the building drawings from a building information model can include importing floor plan objects and/or domain entities from the building information model.

The building information model 112 can include building information modeling data associated with the building managed by the building management system. The building information modeling data can include data associated with (e.g., quantities, properties, and/or statuses of) the components (e.g., control components), equipment, devices, networks (e.g., control networks), areas, spaces, and/or properties of the building. For example, the building information modeling data can include architectural, mechanical, electrical, plumbing, sanitary, fire, geometrical, and/or spatial (e.g., spatial relationship) information associated with the building.

For example, building information model 112 can include a floor plan (e.g., an architectural layout, such as an area, floor and/or room layout) of the building and HVAC devices (e.g., HVAC equipment) in (e.g., located and/or used in) the building, among other types of building information modeling data. The HVAC devices in the building can include, for example, a chiller(s) (e.g., chiller plant), boiler(s) (e.g., boiler plant), pump(s), fan(s), air damper(s) such as a variable air volume (VAV) damper, air handling unit(s) (AHUs) (e.g., AHU plant), coil(s) such as a heating and/or cooling coil, air filter(s), and/or cooling tower(s), among other HVAC devices.

Computing device 102 can apply a design language associated with the building management system to the floor plan objects imported from the CAD drawings and/or the building information model. A particular design language can include multiple themes. For example, the user can choose to apply a particular theme within a specified design language to the floor plan objects.

A particular theme included within a particular design language can include multiple styles for the number of different floor plan space types included within a particular floor plan object. Applying a particular theme to the floor plan objects can include applying a number of styles to the number of floor plan space types associated with a number of floor plan zones. For example, a floor plan space type designated as an office can have a different style from a floor plan space type designated as a conference room.

A particular style can include elements such as stroke color, stroke width, fill color, dash style, font type, font color, font size, and/or icon images. For example, a user can select a floor plan space type such as an office to have a particular style (e.g., a light blue color for the fill), and a conference room to have a particular style that is different from the style of the office (e.g., a dark blue color for the fill). Further, a user can select the walls to contain a particular line style and color (e.g., a solid white line). Additionally, a user can select a specific icon type for different types of domain entities.

Themes can be stored in design language library 114 illustrated in FIG. 1. Design language library 114 can store decorate themes and styles. For example, design language library 114 can store multiple themes each containing multiple styles (e.g., multiple different combinations of stroke color, stroke width, fill color, dash style, font type, font color, font size, and/or icon images). In some instances, the design language library 114 can be located within computing device 102 or externally on a cloud network device or other server device and can communicate with computing device 102 using a communication system (e.g., the Internet and/or other network).

In some embodiments, the user can add one or more new styles to design language library 114. A user can, through user interface 108, create a new style within a theme. For example, a user can create a style for a particular floor plan space type (e.g., an office) by specifying attributes such as the fill color, the type of fill (e.g., full, hatched, cross-hatched, etc . . . ), font type, font size, font color, stroke color, and/or icon images. User interface 108 can also provide preview functionality to enable the user to "preview" the style in the space without applying the style.

In some embodiments, the user can add one or more new themes to design language library 114. A user can, through user interface 108, create a new theme with a number of different styles. For example, a user can create a new theme for a particular design language by specifying the style to be applied to each of the number of floor plan space types (e.g., offices receive style 1, conference rooms receive style 2, etc . . . ).

In some embodiments, the user can apply a new theme to a number of floor plan objects. For example, once a user has created a new theme, the user can choose to apply that new theme to the floor plan objects via user interface 108, as will be further described herein.

In some embodiments, the user can delete a created theme or style from design language library 114. For example, a user can, through user interface 108, delete created styles or themes.

By using a design language library, embodiments of the present disclosure can increase automation over previous approaches, thereby reducing time and/or error(s) associated with user extraction of building objects and/or domain entities, for instance. Additionally, some embodiments of the present disclosure can be used throughout a lifetime of a building (e.g., design phase and/or operation phase) by being updated, added to, deleted, and/or otherwise modified (e.g., by a user), for instance.

Computing device 102 can generate an image of the building (e.g., building image 116 shown in FIG. 1) for the building management system using the assigned floor plan space types, the assigned domain entity types, and the design language applied (e.g., styles applied to the floor plan space types and domain entity types) to the floor plan objects imported from either the CAD drawings or a building information model. For example, the computing device 102 can export building image 116 with the appropriate design language (e.g., correct themes and styles) for use in a building management system. Building image 116 can be generated with a user-defined size and transparency, as will be described further herein. Building image 116 can be displayed by user interface 108.

Building image 116 can be generated as a raster image, with a user-defined size, transparency, and resolution. For example, the raster image can be generated with a resolution of 40,000×40,000 pixels. However, embodiments of the present disclosure are not limited to a particular resolution. Further, building image 116 can be exported in various image file formats, including .BMP, .JPEG, .PNG, .TIFF, or any other suitable image format for use in a building management system.

Computing device 102 can overlay the generated building image 116 on a different background image for use in the building management system. For example, the user can, via user interface 108, select a background image for building image 116 to be overlaid. The background image can be part of the selected design language. Similarly, the user can select domain entity icon images for the domain entities and overlay the domain entity icons on the building image at locations corresponding to the domain entity locations.

Further, the computing device 102 can export domain entity information for use in the building management system. Domain entity information can include information regarding the type of domain entity (e.g., security cameras), the position of the domain entity (e.g., locations of security cameras), and/or the name of the domain entity (e.g., "Security Cameras on Third Floor"). Domain entity information can be exported in various types of file formats, including .XML, .TXT, or any other suitable file format for use in a building management system.

Figure 2A:
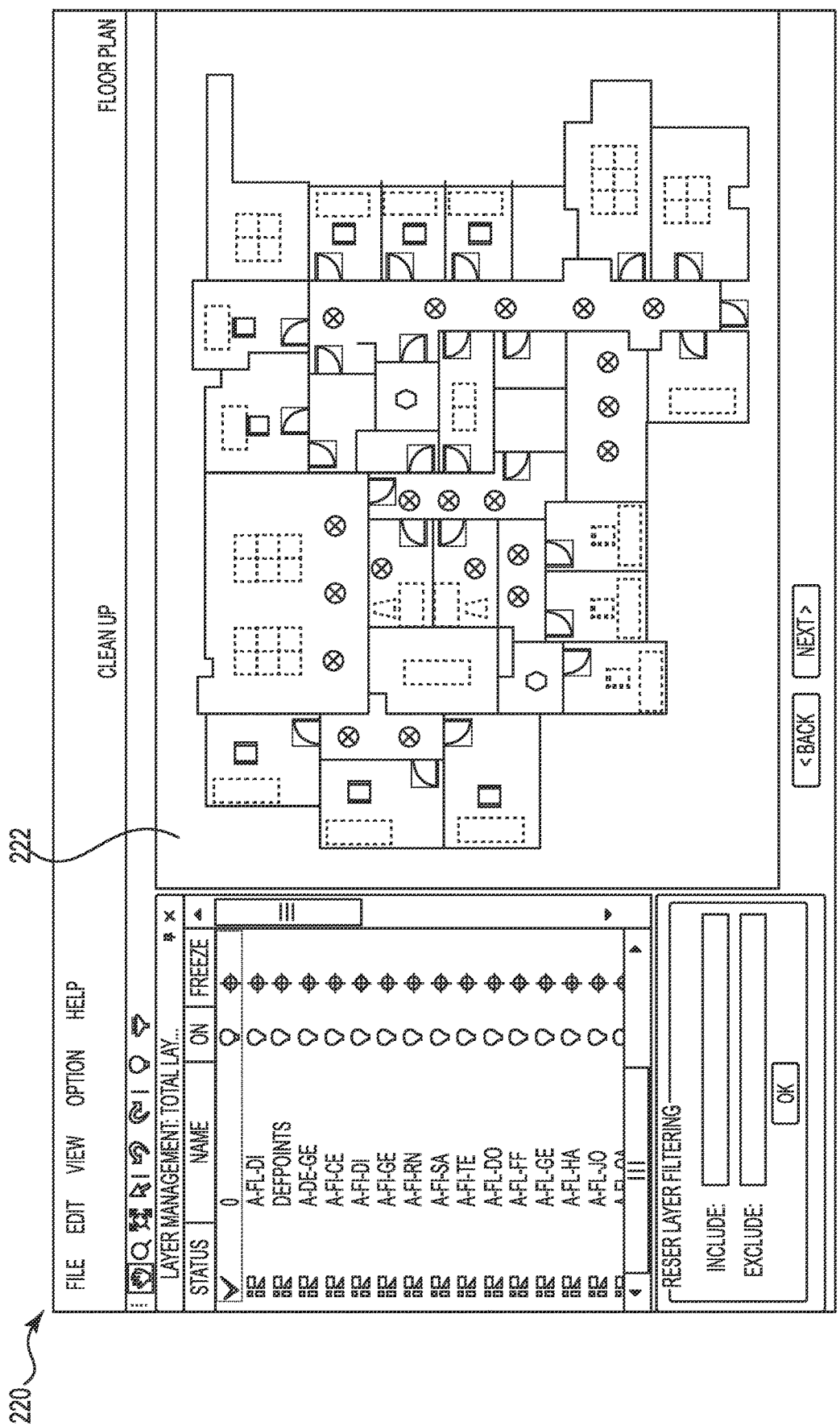
FIGS. 2A-2B show an illustration of a display on a user interface showing reducing CAD drawings to basic geometric features, in accordance with one or more embodiments of the present disclosure.

FIG. 2A is an illustration of a display 220 on a user interface (e.g., user interface 112, previously discussed in connection with FIG. 1) showing reducing CAD drawings to basic geometric features, in accordance with one or more embodiments of the present disclosure. As shown in FIG. 2A, input CAD drawing 222 includes multiple levels and layers of building information displayed on a single image. This information can include building layout, heating, ventilation, and air conditioning equipment (HVAC), electrical wiring diagrams detailing the electrical layout, and security items.

Displaying this much information to the user may be unnecessary and distracting for use in a building management system. For example, a building image may need only several layers of information to keep the drawing clean, as well as keeping the image in accordance with a design language selected for the building management system.

Figure 2B:
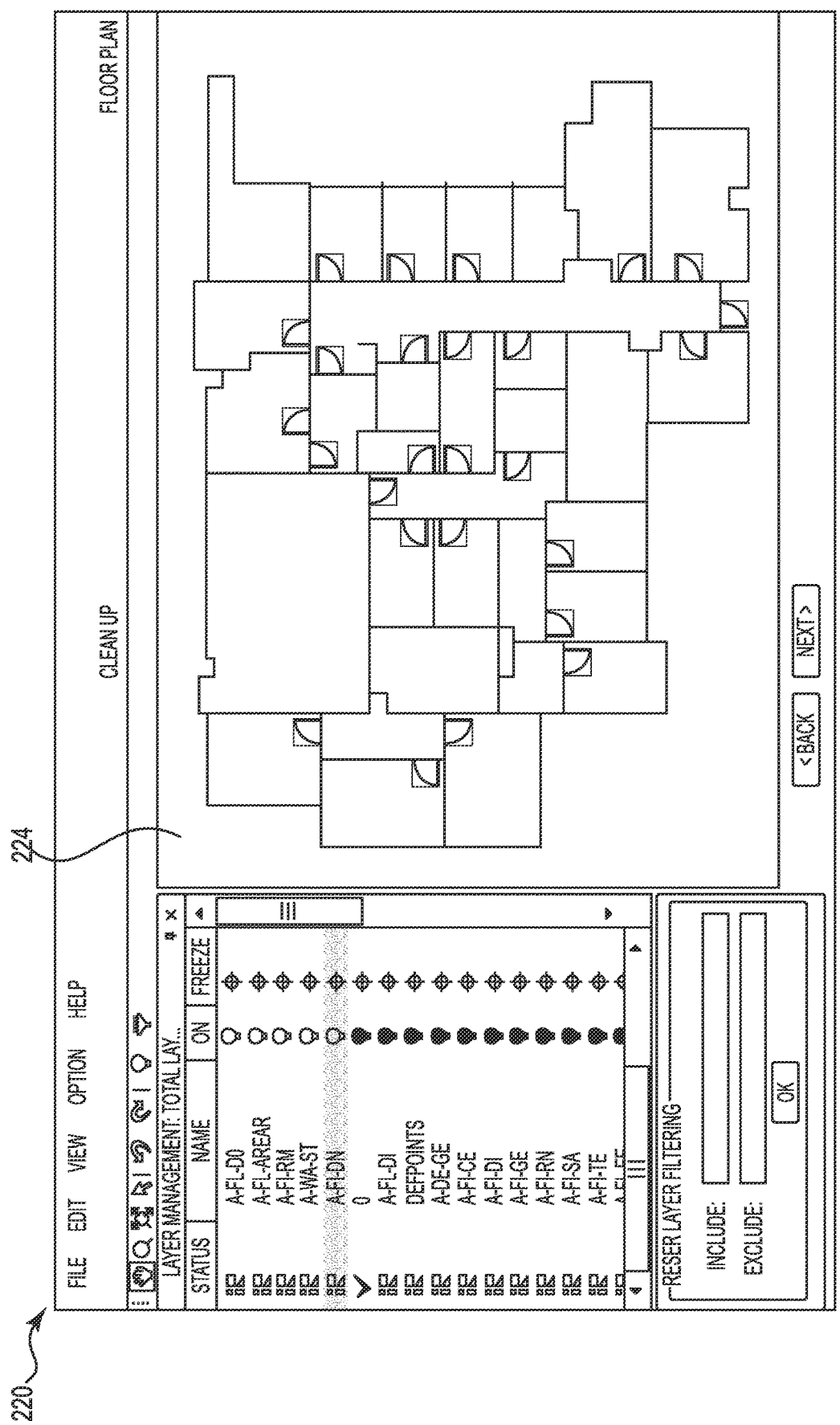

FIG. 2B is an illustration of a display on a user interface (e.g., user interface 112, previously discussed in connection with FIG. 1) showing output CAD drawings reduced to basic geometric features, in accordance with one or more embodiments of the present disclosure. Output CAD drawing 224 displays, via the user interface, the building layout with only basic geometric features shown, such as lines, arcs, rectangles, and simple texts. Although illustrated as being displayed on separate displays, input CAD drawing 222 and output CAD drawing 224 can both be shown on a single screen.

Figure 3:
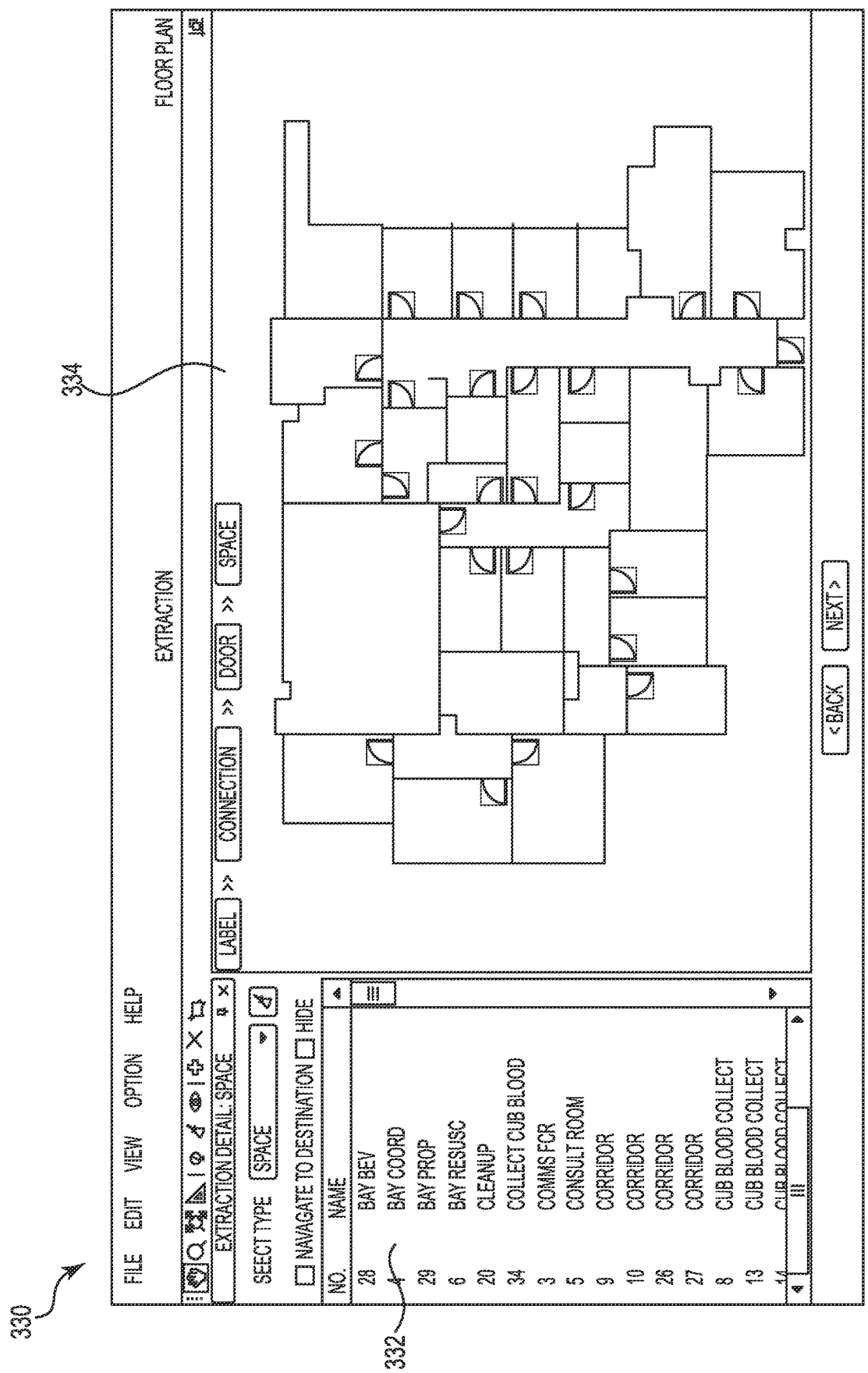
FIG. 3 is an illustration of a display on a user interface showing importing floor plan object labels, floor plan object boundaries, and binding the labels with the boundaries, in accordance with one or more embodiments of the present disclosure.

FIG. 3 is an illustration of a display 330 on a user interface (e.g., user interface 112, previously discussed in connection with FIG. 1) showing importing floor plan object labels, floor plan object boundaries, and binding the labels with the boundaries, in accordance with one or more embodiments of the present disclosure. As shown in FIG. 3, floor plan object labels and floor plan object boundaries are recognized in the CAD drawings and imported by the computing device.

Floor plan object labels and floor plan object boundaries are recognized and highlighted on the user interface via the map display at 334. The list at 332 lists the imported labels and boundaries for the user. The map display at 334 also shows the floor plan object labels bound with the floor plan objects. The floor plan objects are highlighted on the user interface for the user.

Figure 4:
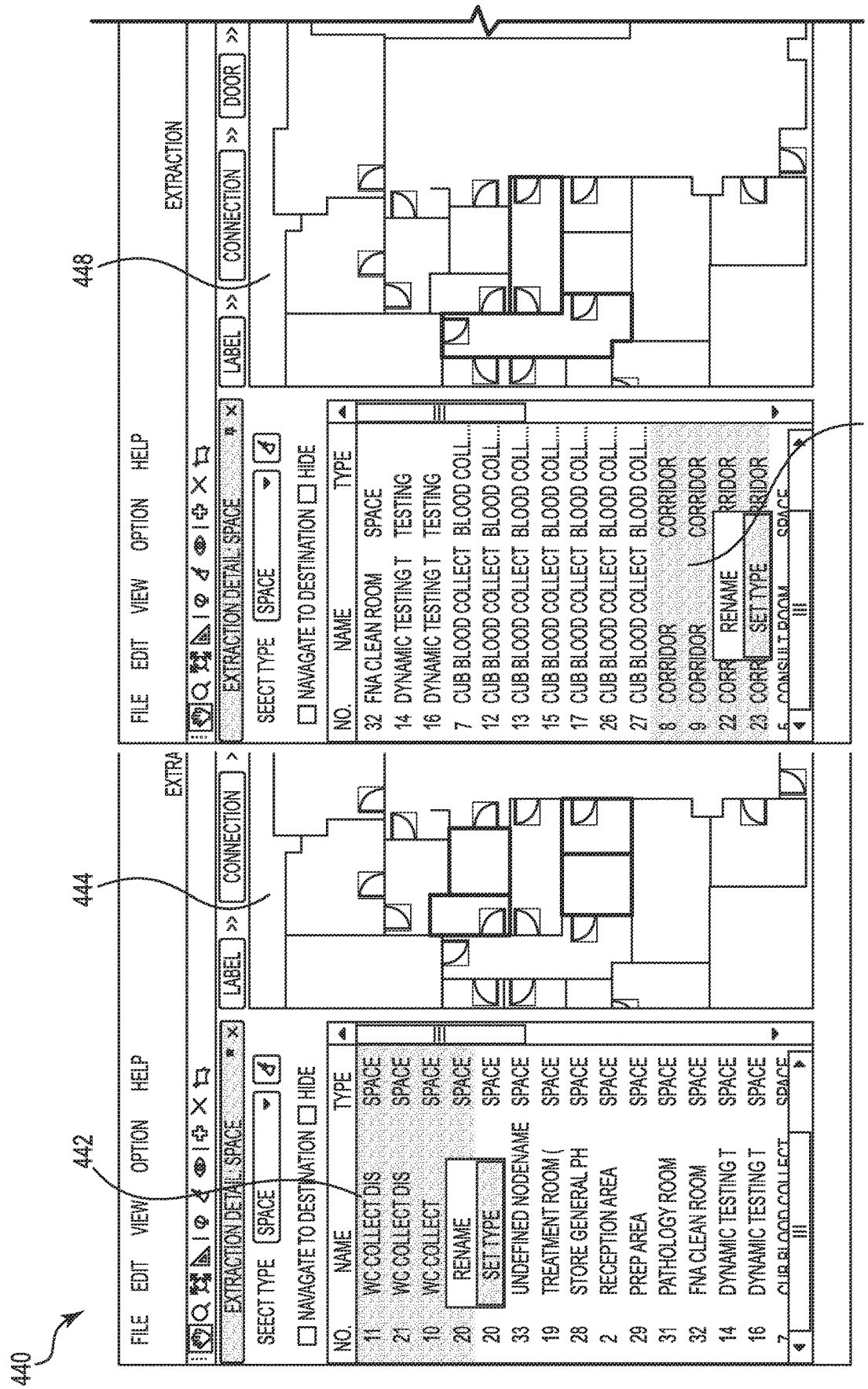
FIG. 4 is an illustration of a display on a user interface showing an assignment of a floor plan space type by a user, in accordance with one or more embodiments of the present disclosure.

FIG. 4 is an illustration of a display 440 on a user interface (e.g., user interface 112, previously discussed in connection with FIG. 1) showing an assignment of a floor plan space type by a user, in accordance with one or more embodiments of the present disclosure. As shown in FIG. 4, a user can assign a floor plan space type for each of the number of floor plan zones in the floor plan objects. For example, a user can set a space type for a number of floor plan zones listed at 442. The floor plan zone corresponding to the floor plan space type selected in the list by the user at 442 is highlighted for the user on the map display at 444. Similarly, a different floor plan zone is listed at 446, and the corresponding floor plan space type is again highlighted for the user at 448.

Figure 5A:
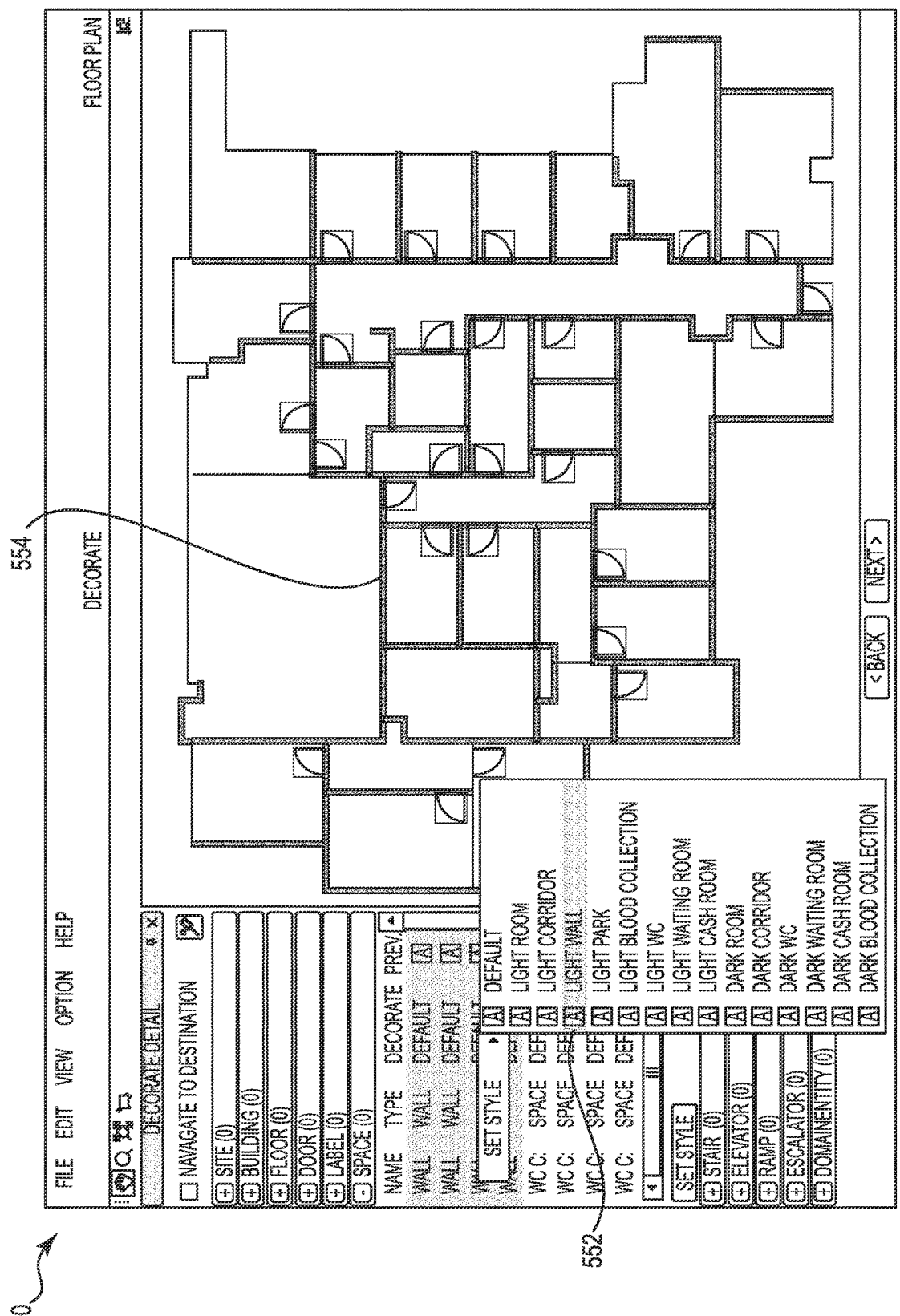

FIG. 5A is an illustration of a display 550 on a user interface (e.g., user interface 112, previously discussed in connection with FIG. 1) showing the application of a design language to floor plan objects, in accordance with one or more embodiments of the present disclosure. As shown in FIG. 5A, the computing device can apply a particular style within a theme included in the design language to zones in the floor plan objects that are of the same floor plan space type.

A particular floor plan can contain multiple themes that vary depending on the floor plan space type contained within a number of zones in the floor plan objects. For example, a user can select the walls of a floor plan at 552 and apply a theme entitled "Light Wall" to the selected walls. The walls selected by the user are highlighted for the user on the map display at 554. The selected theme is then applied to the selected walls.

FIG. 5B is an illustration of a display 550 on a user interface (e.g., user interface 112, previously discussed in connection with FIG. 1) showing the application of a design language to floor plan objects, in accordance with one or more embodiments of the present disclosure. Similar to FIG. 5A, a user can select the floor plan space type "Rooms" at 556 and apply the theme "Light Room", and the corresponding theme is applied and shown to the user at 558.

Figure 5C:
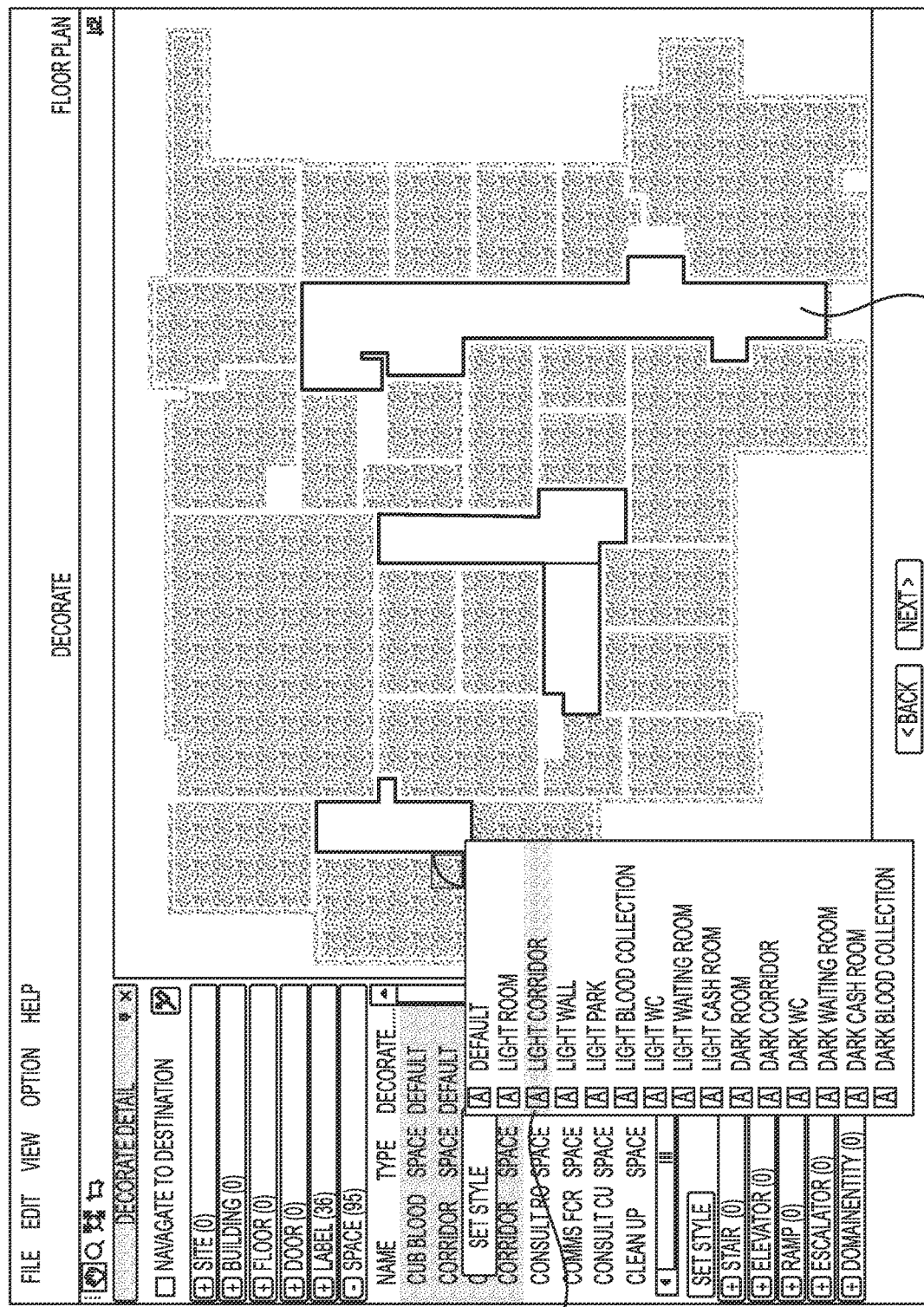

FIG. 5C is an illustration of a display 550 on a user interface (e.g., user interface 112, previously discussed in connection with FIG. 1) showing the application of a design language to floor plan objects, in accordance with one or more embodiments of the present disclosure. Similar to FIG. 5A, a user can select the floor plan space type "Corridors" at 560 and apply the theme "Light Corridor", and the corresponding theme is applied and shown to the user at 562.

Figure 5D:
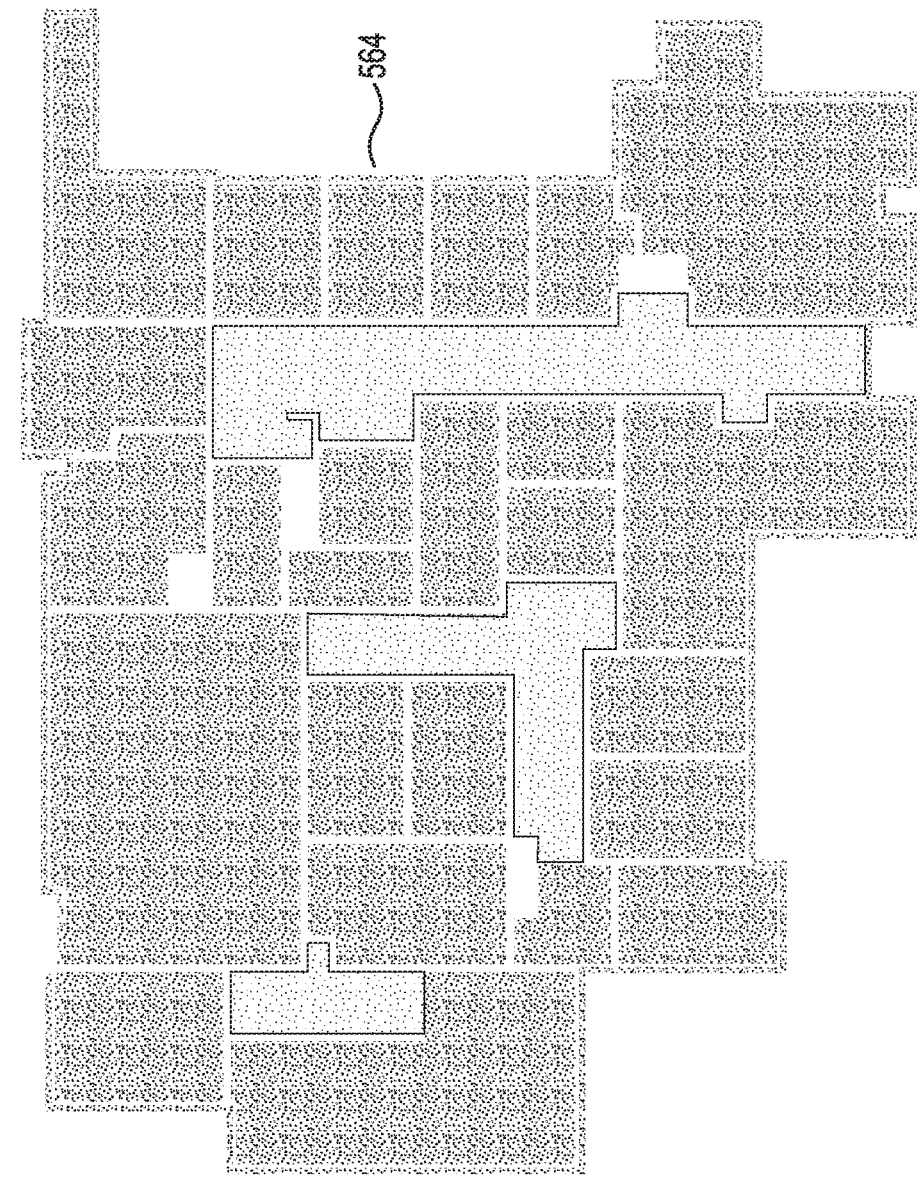

FIG. 5D is an illustration of a display 550 on a user interface (e.g., user interface 112, previously discussed in connection with FIG. 1) showing the application of a design language to floor plan objects, in accordance with one or more embodiments of the present disclosure. The results of the application of the design language are shown to the user on the user interface at 564. Although illustrated as being displayed on separate displays, display 550 can show the application of the theme "Light Wall" at 554, "Light Room" at 558, and "Light Corridor" at 562 on a single screen.

In some embodiments, spaces of the same function can be set with the same style in order to distinguish the space type from other spaces. Additionally, applying a theme will set decorate styles for all similar floor plan space types, preventing the user from having to individually set each floor plan space type.

Figure 6:
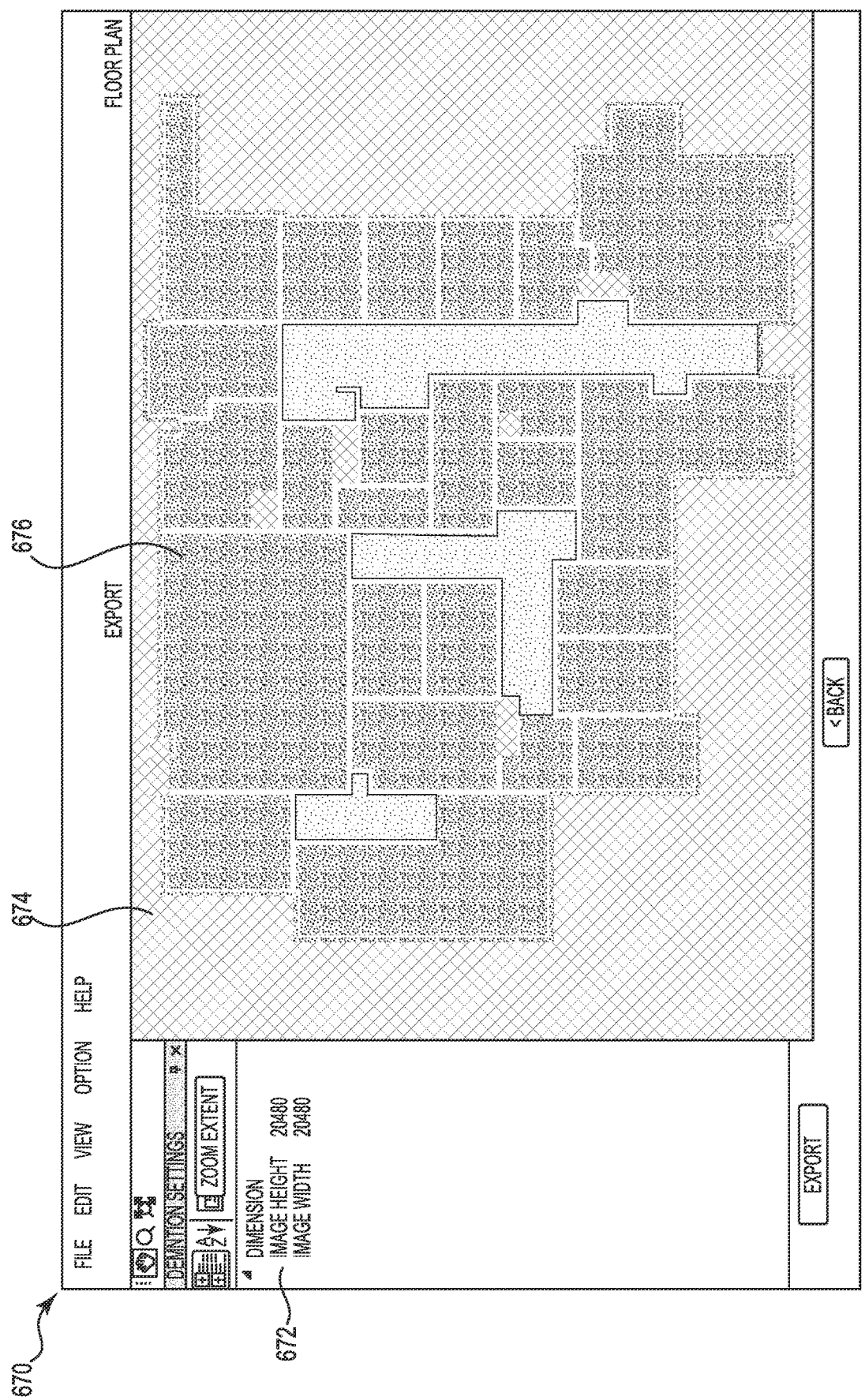
FIG. 6 is an illustration of a display on a user interface showing a generated image for use in a building management system, in accordance with one or more embodiments of the present disclosure.

FIG. 6 is an illustration of a display 670 on a user interface (e.g., user interface 112, previously discussed in connection with FIG. 1) showing a generated image 676 for use in a building management system, in accordance with one or more embodiments of the present disclosure. As shown in FIG. 6, the computing device can generate an image of a building for a building management system using the assigned floor plan space types, the assigned domain entity types, and the design language applied to the floor plan objects.

In various embodiments, building image 676 can be generated with a user-defined resolution, set by the user at 672. Additionally, building image 676 can be generated with a transparent background 674 to allow for overlay on a user-specified background image for use in a building management system.

As used herein, "logic" is an alternative or additional processing resource to execute the actions and/or functions, etc., described herein, which includes hardware (e.g., various forms of transistor logic, application specific integrated circuits (ASICs), etc.), as opposed to computer executable instructions (e.g., software, firmware, etc.) stored in memory and executable by a processor. It is presumed that logic similarly executes instructions for purposes of the embodiments of the present disclosure.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A computing device for generating an image for use by a building management system, comprising:
    a memory;
    a processor configured to execute executable instructions stored in the memory to:
        import floor plan objects from computer-aided design (CAD) drawings of a building or from a building information model associated with the building, wherein:
        the floor plan objects include floor plan domain entities that represent objects of the building management system that provide real-time information to the building management system;
        apply a design language associated with a building management system to at least some of the floor plan objects imported from the CAD drawings or the building information model, the applied design language providing a link between at least some of the floor plan objects, including one or more of the floor plan domain entities, and the building management system;
        generate an image of the building that includes at least some of the floor plan domain entities and at least some of the applied design language, the generated image for use with the building management system, and when the generated image is used by the building management system, at least some of the floor plan domain entities of the generated image are configured to display corresponding real-time information to a user of the building management system; and
        storing the generated image in the memory for subsequent use by the building management system.

2. The computing device of claim 1, wherein the CAD drawings of the building or the building information model includes at least one of architectural, mechanical, electrical, plumbing, sanitary, fire, geometrical, and spatial relationship information associated with the building.

3. The computing device of claim 1, wherein the processor is configured to execute the executable instructions to recognize the floor plan objects imported from the CAD drawings or the building information model.

4. The computing device of claim 1, wherein the processor is configured to execute the executable instructions to import the floor plan objects from the CAD drawings by:
    importing, by the computing device, floor plan object boundaries from the CAD drawings;
    importing, by the computing device, floor plan object labels from the CAD drawings; and
    binding, by the computing device, the floor plan object labels to the floor plan object boundaries.

5. The computing device of claim 1, wherein the processor is configured to execute the executable instructions to apply a particular style within a theme included in the design language to zones in the floor plan objects that are of a same floor plan space type.

6. The computing device of claim 5, wherein the particular style includes one or more of stroke color, stroke width, fill color, dash style, font type, font color, font size, and icon image.

7. A computer implemented method for generating an image for a building management system, comprising:
    importing, by a computing device, floor plan objects from computer-aided design (CAD)
    drawings of a building or from a building information model associated with the building, wherein;
        the floor plan objects include a number of floor plan zones and a number of floor plan domain entities,
        the number of floor plan domain entities represent objects of the building management system that provide real time information to the building management system;

receiving, from a user of the computing device, an assignment of a floor plan space type for each of the number of floor plan zones in the floor plan objects;

receiving, from the user of the computing device, an assignment of a domain entity type for each of the number of floor plan domain entities in the floor plan objects;

applying, using the computing device, a design language associated with a building management system to the floor plan objects imported from the CAD drawings or the building information model, the applied design language providing a link between at least some of the floor plan domain entities and the building management system; and generating, by the computing device, an image that includes at least some of the floor plan domain entities and at least some of the applied design language, the generated image for use with the building management system, and when the generated image is used by the building management system, at least some of the floor plan domain entities of the generated image are configured to display corresponding real-time information to a user of the building management system; and storing the generated image for subsequent use by the building management system.

8. The method of claim 7, wherein importing the floor plan objects from the CAD drawings includes simplifying the CAD drawings to basic geometric features.

9. The method of claim 7, wherein the floor plan space type for each respective floor plan zone describes a purpose of that respective floor plan zone.

10. The method of claim 7, wherein applying the design language associated with the building management system to the floor plan objects includes applying a theme to the floor plan objects.

11. The method of claim 10, wherein applying the theme to the floor plan objects includes applying a number of styles to the number of floor plan zones based on the assigned floor plan space type.

12. The method of claim 10, wherein the theme is stored in a design language library.

13. The method of claim 12, wherein the user can add one or more of a new style or a new theme to the design language library.

14. The method of claim 10, wherein the user can apply the new theme to the number of floor plan objects.

15. A non-transitory computer readable medium having computer readable instructions stored thereon that are executable by a processor to:

import floor plan objects from computer-aided design (CAD) drawings of a building or from a building information model associated with the building, wherein:

the floor plan objects include a number of floor plan zones and a number of floor plan domain entities, the number of floor plan domain entities represent objects of the building management system that provide real time information to the building management system receive, from a user, an assignment of a floor plan space type for each of the number of floor plan zones in the floor plan objects;

receive, from the user, a domain entity type for each of the number of floor plan domain entities in the floor plan objects;

apply a design language associated with a building management system to the floor plan objects imported from the CAD drawings or the building information model, the applied design language providing a link between at least some of the floor plan domain entities and the building management system; and generate an image that includes at least some of the floor plan domain entities and at least some of the applied design language, the generated image for use with the building management system, and when generated image is used by the building management system, at least some of the floor plan domain entities of the generated image are configured to display corresponding real-time information to a user of the building management system; and store the generated image for subsequent use by the building management system.

16. The computer readable medium of claim 15, wherein the generated image includes a raster image.

17. The computer readable medium of claim 15, wherein the computer readable instructions are executable by the processor to overlay the generated image on a background image.

18. The computer readable medium of claim 15, wherein the computer readable instructions are executable by the processor to export domain entity information for use in the building management system.

19. The computer readable medium of claim 18, wherein the domain entity information includes one or more of type, position, and name.

* * * * *